(12) United States Patent
Anelle

(10) Patent No.: US 7,343,209 B2
(45) Date of Patent: Mar. 11, 2008

(54) ATTRIBUTE-BASED ITEM INFORMATION GROUPING, SUCH AS FOR USE IN GENERATING MANUFACTURING INSTRUCTIONS

(75) Inventor: Joseph Anelle, Seattle, WA (US)

(73) Assignee: The Boeing Company, Chicago, IL (US)

( * ) Notice: Subject to any disclaimer, the term of this patent is extended or adjusted under 35 U.S.C. 154(b) by 40 days.

(21) Appl. No.: 11/269,458

(22) Filed: Nov. 8, 2005

(65) Prior Publication Data

US 2007/0106409 A1    May 10, 2007

(51) Int. Cl.
G05B 19/42 (2006.01)
(52) U.S. Cl. ............... 700/87; 700/97; 283/81
(58) Field of Classification Search ........... 700/87, 700/97; 703/1; 705/26; 283/81
See application file for complete search history.

(56) References Cited

U.S. PATENT DOCUMENTS

| | | | |
|---|---|---|---|
| 5,608,619 A | * | 3/1997 | Brantmark et al. ........... 700/87 |
| 6,513,352 B1 | * | 2/2003 | Mainville ................... 70/166 |
| 2004/0158341 A1 | * | 8/2004 | Kano et al. ................. 700/97 |
| 2005/0203718 A1 | * | 9/2005 | Carek et al. ................. 703/1 |
| 2005/0225078 A1 | * | 10/2005 | Byskov et al. .............. 283/81 |
| 2006/0129462 A1 | * | 6/2006 | Pankl et al. ................ 705/26 |

* cited by examiner

Primary Examiner—Leo Picard
Assistant Examiner—Sheela Rao
(74) Attorney, Agent, or Firm—Perkins Coie LLP

(57) ABSTRACT

Managing attribute information to provide output for other applications (e.g., applications for generating manufacturing instructions) may involve identifying attribute information associated with instances of a selected item type (e.g., parts fasteners). For example, in the case of fasteners, each of the instances of the selected item type is associated with a common part or product. The instances of the selected item type may then be sorted into initial groups based on grouping criteria such as part ID number, etc. Proximity rules may then be applied to the sorted instances. Applying proximity rules to the sorted instances may include grouping the instances into groups depending on whether or not have common relationships with other items. For example, in the case of fasteners, the proximity rules may involve determining whether each fastener passes through the same set of solids and/or shares common attributes.

27 Claims, 7 Drawing Sheets

Fastener Collector File Data (Prior Art)

| Component Name | Part Number | Hole Number | Wet Install | Stackup | Fastener Type | Mate |
|---|---|---|---|---|---|---|
| ST3M761V3-4 | ST3M761V3-4_STD-PIN-RIVET | 305401 -0142 | YES | 0.22 | PINS "HI LOK"/"HI TIGUE" | 74A305401_74A305408 |
| ST3M761V3-4 | ST3M761V3-4_STD-PIN-RIVET | 305401 -0141 | YES | 0.22 | PINS "HI LOK"/"HI TIGUE" | 74A305401_74A305408 |
| ST3M761V3-4 | ST3M761V3-4_STD-PIN-RIVET | 305401 -0140 | YES | 0.22 | PINS "HI LOK"/"HI TIGUE" | 74A305401_74A305400 |
| ST3M761V3-4 | ST3M761V3-4_STD-PIN-RIVET | 305401 -0139 | YES | 0.22 | PINS "HI LOK"/"HI TIGUE" | 74A305401_74A305400 |
| ST3M761V00-7 | ST3M761V00-7_STD-PIN-RIVET | 305101 -0199 | YES | 0.249 | BLIND RIVET | 74A305101_74A305002 |
| ST3M761V08-5 | ST3M761V08-5_STD-PIN-RIVET | 305101 0200 | YES | 0.249 | BLIND RIVET | 74A305101_74A305802 |
| ST3M761V08-3 | ST3M761V08-3_STD-PIN-RIVET | 305101 0201 | YES | 0.183 | BLIND RIVET | 74A305101_74A305802 |
| ST3M761V08-3 | ST3M761V08-3_STD-PIN-RIVET | 305101 0231 | YES | 0.183 | PINS "HI LOK"/"HI TIGUE" | 74A305101_74A305802 |
| ST3M761V08-3 | ST3M761V08-3_STD-PIN-RIVET | 305401 -0233 | YES | 0.183 | PINS "HI LOK"/"HI TIGUE" | 74A305401_74A305802 |
| ST3M761V08-3 | ST3M761V08-3_STD-PIN-RIVET | 305401 -0232 | YES | 0.183 | PINS "HI LOK"/"HI TIGUE" | 74A305401_74A305802 |
| ST3M761V08-3 | ST3M761V08-3_STD-PIN-RIVET | 305401 -0231 | YES | 0.183 | PINS "HI LOK"/"HI TIGUE" | 74A305401_74A305802 |
| ST3M719C3M1 | ST3M719C3M1_STD-NUT | 305401 -0059 | NO | 0.12 | BLIND RIVET | 74A661366_74A661265 |
| ST3M683-3 | ST3M683-3_STD-WASHER | 305401 -0199 | YES | 0.349 | BLIND RIVET | 74A305401_74A305802 |
| ST3M683-3 | ST3M683-3_STD-WASHER | 305401 -0200 | YES | 0.249 | BLIND RIVET | 74A305401_74A305802 |
| ST3M6UBNUBMF | ST3M6UBNUBMF_STD-COLLAR | 305401 -0199 | YES | 0.349 | BLIND RIVET | 74A305401_74A305802 |
| ST3M6NRNRNRMF | ST3M6NRNRNRMF_STD-COLLAR | 305401 -0200 | YES | 0.249 | BLIND RIVET | 74A305401_74A305802 |
| ST3M526C3M | ST3M526C3M_STD-COLLAR | 305401 -0142 | YES | 0.22 | PINS "HI LOK"/"HI TIGUE" | 74A305401_74A305802 |
| ST3M526C3M | ST3M526C3M_STD-COLLAR | 305401 -0141 | YES | 0.22 | PINS "HI LOK"/"HI TIGUE" | 74A305401_74A305802 |
| ST3M526C3M | ST3M526C3M_STD-COLLAR | 305401 -0140 | YES | 0.22 | PINS "HI LOK"/"HI TIGUE" | 74A305401_74A305408 |
| ST3M526C3M | ST3M526C3M_STD-COLLAR | 305401 -0139 | YES | 0.22 | BLIND RIVET | 74A305401_74A305802 |
| ST3M526C08M | ST3M526C08M_STD-COLLAR | 305401 -0201 | YES | 0.183 | BLIND RIVET | 74A305401_74A305802 |
| ST3M526C08M | ST3M526C08M_STD-COLLAR | 305401 -0234 | YES | 0.183 | PINS "HI LOK"/"HI TIGUE" | 74A305401_74A305802 |
| ST3M526C00M | ST3M526C00M_STD-COLLAR | 305401 -0233 | YES | 0.100 | PINS "HI LOK"/"HI TIGUE" | 74A305401_74A305002 |
| ST3M526C00M | ST3M526C00M_STD-COLLAR | 305401 -0232 | YES | 0.100 | PINS "HI LOK"/"HI TIGUE" | 74A305401_74A305002 |
| ST3M526C00M | ST3M526C00M_STD-COLLAR | 305401 -0231 | YES | 0.100 | PINS "HI LOK"/"HI TIGUE" | 74A305401_74A305002 |
| ST3M413 1A1 | ST3M413 1A1_STD NUT | 305101 0224 | NO | 0.12 | STD NUT | |
| ST3M413 1A1 | ST3M413 1A1_STD NUT | 305101 0223 | NO | 0.12 | STD NUT | |
| ST3M413 1A1 | ST3M413 1A1_STD NUT | 305101 0222 | NO | 0.12 | STD NUT | |
| ST3M443-3A1 | ST3M443-3A1_STD-NUT | 305401 -0060 | NO | 0.12 | STD-NUT | 74A305401_74A661301 |
| ST3M443-3A1 | ST3M443-3A1_STD-NUT | 305401 -0127 | NO | 0.12 | STD-NUT | 74A305401_74A681404 |
| ST3M442-3A1 | ST3M442-3A1_STD-NUT | 305401 -0202 | NO | 0.12 | BLIND RIVET | |
| hole_ST3M761V3-4 | ST3M761V3-4 | 305401 -0142 | | 0.22 | | 74A305401_74A305408 |
| hole_ST3M761V3-4 | ST3M761V3-4 | 305401 -0141 | | 0.22 | | 74A305401_74A305408 |
| hole_ST3M761V3-4 | ST3M761V3-4 | 305401 -0140 | | 0.22 | | 74A305401_74A305408 |

FIG. 1

ATTRIBUTE-BASED ITEM INFORMATION GROUPING, SUCH AS FOR USE IN GENERATING MANUFACTURING INSTRUCTIONS

BACKGROUND

Complex products such as airplanes, automobiles, and computers typically go through both a design stage and a manufacturing stage. During the design stage, design engineers plan the product using specifications, drawings, plans, and models that include descriptive information, graphical information, numerical information, mathematical information, etc. During the manufacturing stage, manufacturing engineers use the design engineers' drawings, plans, and models to build the product itself. Depending on how complex the product is, the manufacturing process is broken down and organized into more manageable portions, so that the complex product can be built efficiently and effectively.

Currently, complex product design is often aided through the use of computers and computer software that allow for design data input, processing, and modeling. In addition, computers and computer software allow for the reuse of design information (e.g., so that a design engineer does not have to "reinvent the wheel" each time he or she goes to design a new product). For example, design engineers may use computer-aided-drafting/design (CAD) software to help in designing drawings and plans. Some CAD products also have modeling capabilities that use attribute information from product/part designs to build three-dimensional models that can be used for testing and other uses. An example of such a software package is CATIA, by Dassault Systèmes S.A., of France. CATIA is an integrated suite of computer aided design (CAD), computer aided engineering (CAE), and computer aided manufacturing (CAM) applications for product definition and simulation. In general, software packages like CATIA allow manufacturers to facilitate industrial design processes from the pre-project phase through detailed design, analysis, simulation, assembly, and maintenance.

On the manufacturing side, part/product attribute information from computer generated drawings, plans, bills of materials, and models may be used to create work instructions and manufacturing process plans for use by manufacturing engineers. However, it is not always easy to capture such part/product attribute information for this type of use, and several data management issues may arise with respect to how data is collected an organized. An example of specific part/product attribute information relates to fasteners and the holes through which those fasteners fit. In some existing technologies, fastener collector files are used to manage large quantities of fastener and hole attribute information. However, because of the way it is configured, the information in these fastener collector files is not conducive in allowing manufacturing engineers to conduct process planning and work instruction authoring activities. For example, as shown in FIG. 1, attribute data in the fastener collectors files may be captured in a format that is difficult for humans to work with. It may also be incompatible with manufacturing-side computerized processes.

SUMMARY

An attribute information collector facility that logically gathers item attribute information, such as design engineering data and geometry information from design models, is provided herein. In some embodiments, based on a common data scheme the collector facility sorts/groups items based on initial grouping criteria, such as geometry information and part attributes collected from an engineering product definition. The collector facility may then perform proximity checking to further group the items so that the resulting groups include items located in a contiguous volume, and/or that have similar relationships to other items. For example, the items can be fasteners (and associated holes) used to assemble parts together in a manufacturing process (e.g., in the aerospace industry). In the case of fasteners, the proximity checking may include identifying fasteners that pass through the same set of parts. Manufacturing requirements may also play a role in the grouping. In another example, the items can be spot welds (e.g., used in the automotive industry). The grouping of spot welds can then be used, for example, in generating welding robot programming instructions. The collector facility may be used to group other items as well (e.g., other parts used in manufacturing, retail items, items in a database, etc.).

Information related to the item groupings (including, e.g., the attribute and geometry information) may be captured in a collector data structure, which includes information that may be subject to additional processing or display. For example, in the case of fasteners, the collector utility may organize fasteners and their related holes into logical fastener working group objects. Via the groupings, the facility allows manufacturing engineers to easily consume individual item information (e.g., fastener and hole information), which can otherwise constitute a very large amount of information in a large product, such as an airplane. In addition, the information relating to the item groupings can be used in other processes (e.g., in authoring work instructions related to hole drilling and fastener installation). More specifically, with respect to fasteners, these groupings allow for work instructions to be more easily generated because they help to determine how a part can be most easily and efficiently assembled. For example, instructions generated based on the groupings may allow the manufacturing engineer to work most efficiently because the fasteners in each group are such that they can be installed in sequence using more or less the same parts, machines, techniques, tools, placements, etc. In other words, the groupings may be such that is most efficient to install fasteners in the order that they are grouped, rather than in some other order. Thus, in some embodiments, the collector facility may be used to improve the accuracy of resulting manufacturing work instructions, simplify manufacturing configuration management activities, increase efficiency and productivity, and provide other benefits.

BRIEF DESCRIPTION OF THE DRAWINGS

FIG. 1 is a display diagram showing an example of a fastener collector file.

DETAILED DESCRIPTION

An attribute information collector facility that logically gathers design engineering data and geometry information from design models is provided herein. Certain specific details are set forth in the following description and in FIGS. 2-7 to provide a thorough understanding of various embodiments of the facility. Well-known structures, systems and methods often associated with computer aided design/computer aided engineering/computer aided manufacturing (CAD/CAE/CAM) environments have not been shown or described in detail to avoid unnecessarily obscuring the description of the various embodiments of the invention. Those of ordinary skill in the relevant art will understand that additional embodiments of the present invention may be practiced without several of the details described below.

Many embodiments of the facility described below may take the form of computer-executable instructions, including routines executed by a programmable computer (e.g., a computer-controlled design process). Those skilled in the relevant art will appreciate that the facility and associated aspects can be practiced with other computer system configurations as well. The facility and associated aspects can be embodied in a special-purpose computer or data processor that is specifically programmed, configured, or constructed to perform one or more of the computer-executable instructions described below. Accordingly, the term "computer" as generally used herein refers to any data processor and includes Internet appliances, hand-held devices (including palm-top computers, wearable computers, cellular or mobile phones, multi-processor systems, processor-based or programmable consumer electronics, network computers, minicomputers and the like).

The facility can also be practiced in distributed computing environments, where tasks or modules are performed by remote processing devices that are linked through a communications network. In a distributed computing environment, program modules or subroutines may be located in both local and remote memory storage devices. Aspects of the invention described below may be stored or distributed on computer-readable media, including magnetic and optically readable and removable computer disks, as well as distributed electronically over networks. Data structures and transmissions of data particular to aspects of the invention are also encompassed within the scope of the invention.

Figure 2:
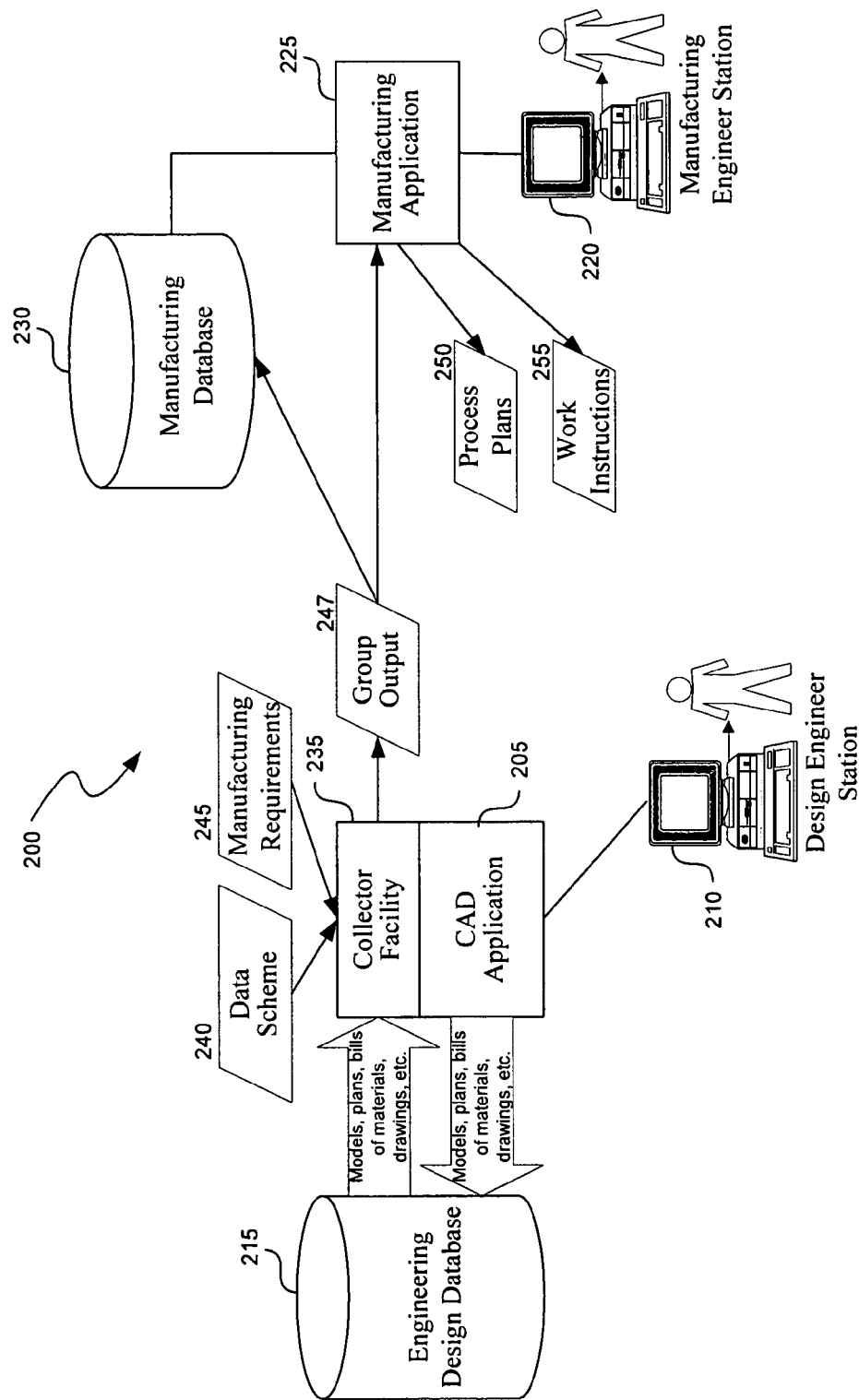
FIG. 2 is a block diagram showing a representative environment in which some embodiments of the facility can be implemented.

FIG. 2 is a block diagram showing an example of a representative environment 200 in which some embodiments of the facility can be implemented. The representative environment 200 includes a computer aided drafting (CAD) application 205 that a design engineer at a design engineer station 210 may use to create models, plans, bills of materials, drawings, etc., relating to a product or part that the engineer is designing. The information generated using the CAD application 205 may be stored in an engineering design database 215. An example of the contents of the engineering design database 215 is described in more detail with respect to FIG. 3.

With respect to the manufacturing side of the representative environment 200, a manufacturing engineer at a manufacturing engineer station 220 uses a manufacturing application 225 to facilitate the manufacture of products and parts designed by the design engineer. In some embodiments, the manufacturing application 225 is associated with the CAD application 205 via a common application environment (e.g., CATIA V5) (not shown). In other embodiments, they are separate applications that may or may not be joined via a common interface. The manufacturing application 225 may access a manufacturing information database 230 containing information used during the manufacturing process. For example, the manufacturing information database 230 may include information about manufacturing requirements, manufacturing machine requirements, manufacturing process, best practices, materials information, etc. The manufacturing information database 230 may also include process plans and work instructions, such as process plans 250 and work instructions 255 generated using a collector facility 235 and process plans and work instructions generated using other means.

In some embodiments, the collector facility 235 takes input information from the engineering design database 215 (e.g., models, plans, building materials, drawings, etc.) along with data scheme information 240 and manufacturing requirements 245 (which may be stored in the manufacturing information database 230) and generates output 247 (e.g., group output) that may be used in the creation of manufacturing process plans 250, work instructions 255, etc., which may then be stored in the manufacturing database 230 and used during product manufacture. For example, in some embodiments, functionality associated with the manufacturing application 225 may use the output 247 of the collector facility 235 to create step by step instructions on how to install fasteners into a group of parts. Various aspects of the collector facility 235 and its input and output are described in more detail with respect to FIGS. 3-7.

Figure 3:
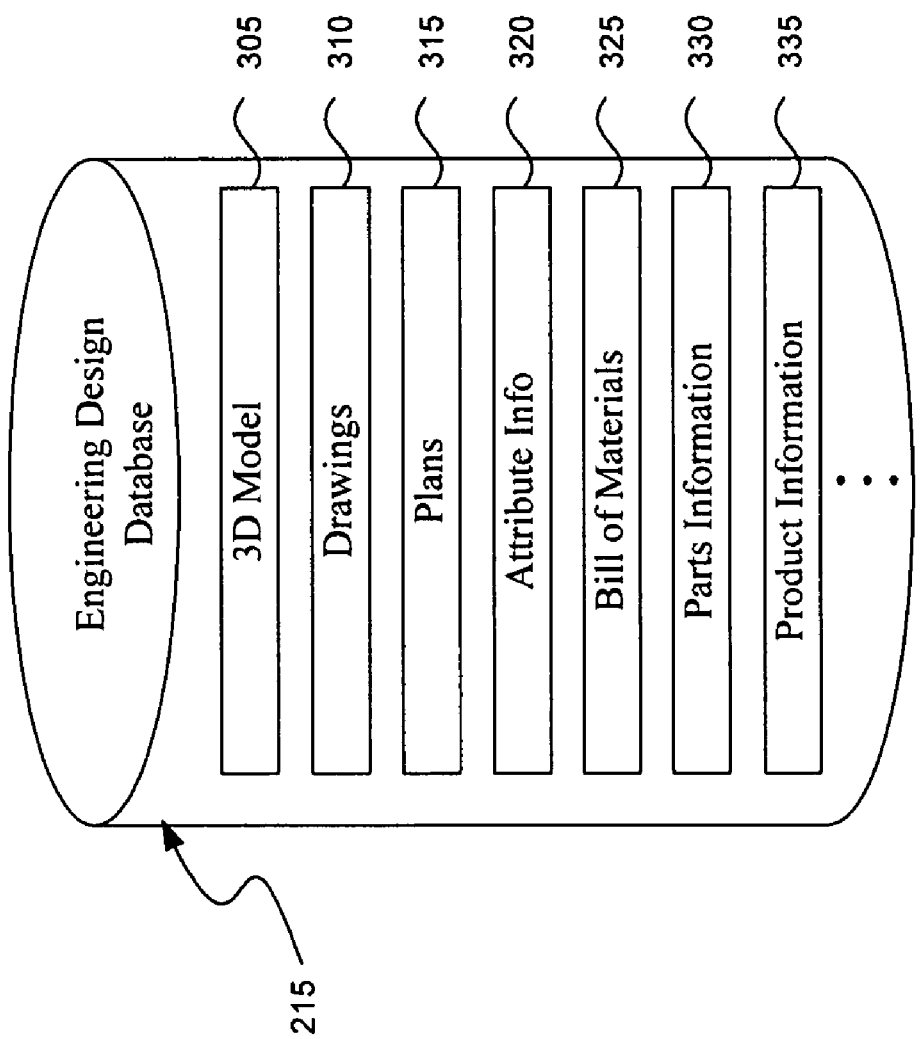
FIG. 3 is block diagram showing sample contents of the engineering design database of FIG. 2 in an embodiment.

FIG. 3 is a block diagram showing the engineering design database 215 of FIG. 2. The engineering design database 215 may include various aspects of design information generated by design engineers using the CAD application 205 of FIG. 2, some of which may be used by the collector facility to generate output for use in creating manufacturing instructions, processes, etc. The engineering design database 215 may include three-dimensional model information 305, engineering drawings to 310, design plans 315, attribute information 320, bill of materials information 325, parts information 330, product information 335, etc. A more specific example of the types of information in the database 215 may include fastener collector files that store attribute information.

Figure 4:
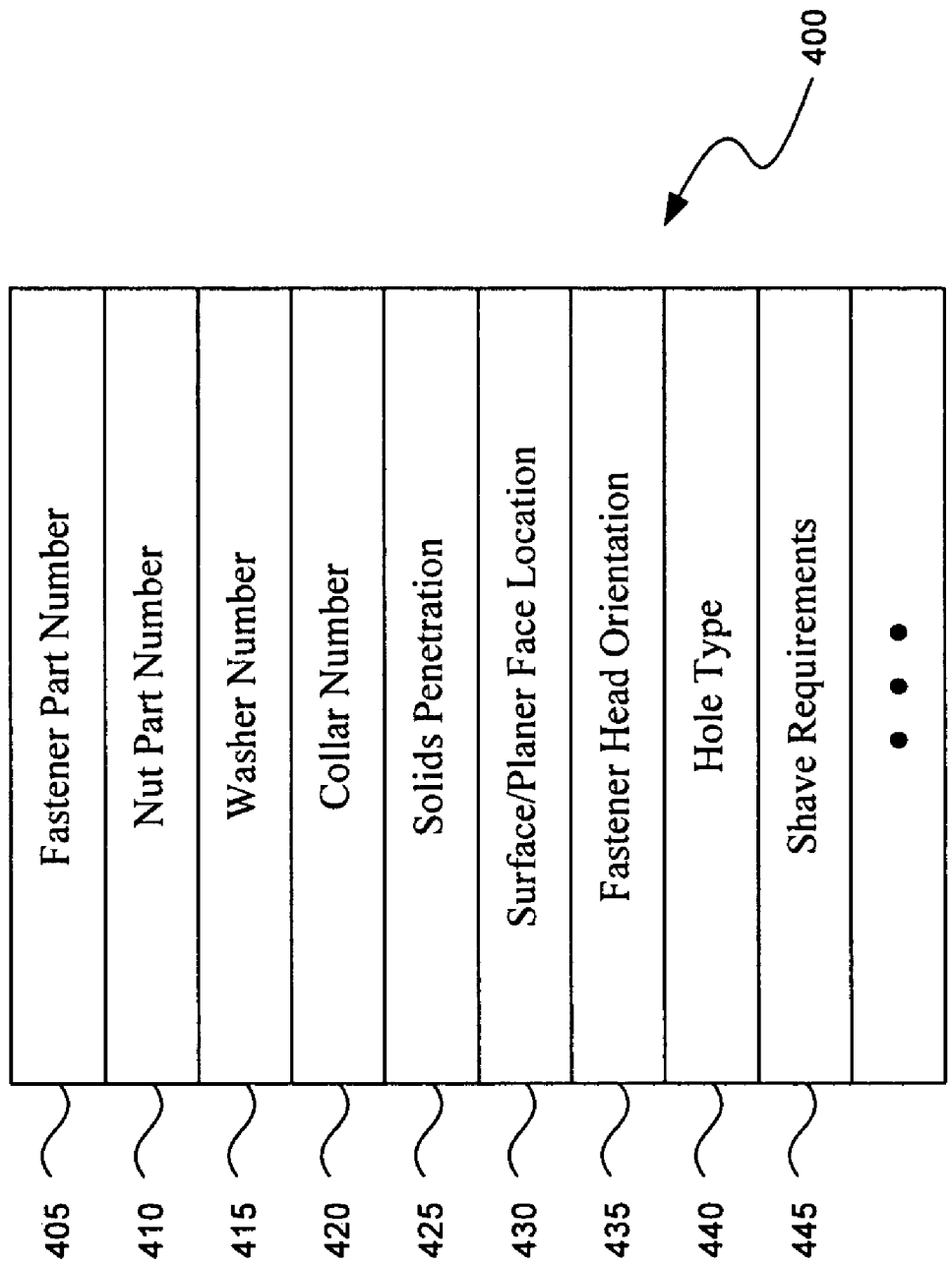
FIG. 4 is a data diagram showing various data types that can be associated with fasteners and fastener attribute information in an embodiment.

FIG. 4 is a data diagram showing an example of attributes for a fastener in a complex product or part. The attributes may include fastener part number 405, nut part number 410, washer number 415, collar number 420, solids penetration information 425, surface/planar space location information 430, fastener head orientation 435, hold type information 440, shave requirements information 445, etc. In some embodiments, the collector facility checks for matches among these attributes when determining how to group fasteners. An example of this is illustrated in more detail with respect to FIG. 7.

Figure 5:
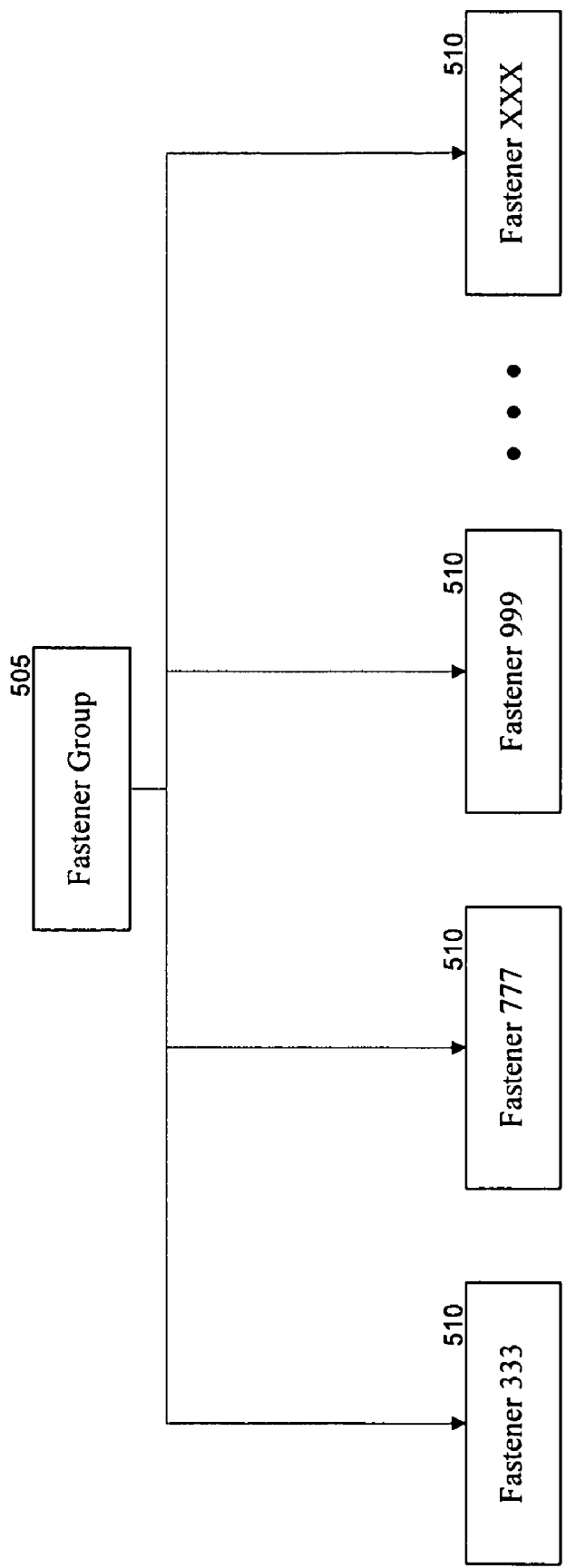
FIG. 5 is a dated diagram showing an object-oriented implementation of a fastener group in an embodiment.

FIG. 5 is a data diagram showing an arrangement of data in a fastener group object, such as would be present in an object oriented programming scheme. In the illustrated embodiment, the fastener group object 505 is a parent group object with various children, each representing an instance of a fastener 510. The configuration of fastener group data illustrated in FIG. 5 is merely one configuration, and other configurations are possible, including non-object oriented configurations. In general, the collector facility may be configured so that the arrangement of data used as output is most useful to the applications making use of that data (e.g., a manufacturing application).

Figure 6:
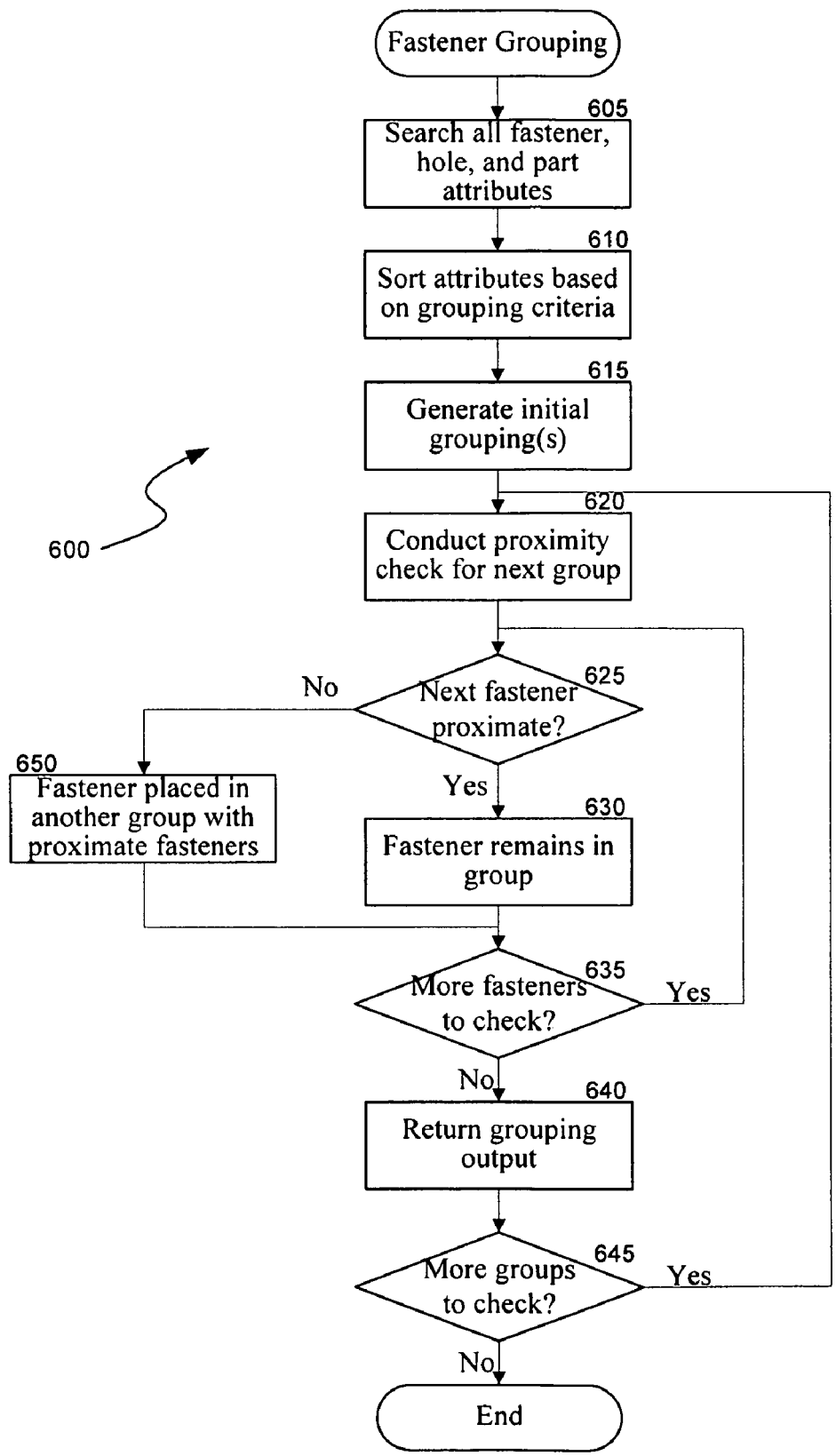
FIG. 6 is a flow diagram showing an example of a routine for grouping fasteners as performed by the facility in an embodiment.

FIG. 6 is a flow diagram showing an example of a routine 600 for grouping fasteners as performed by the facility in some embodiments. At block 605 the routine 600 searches all fastener, hole and part attribute information in a given fastener file. At block 610 the routine 600 sorts fasteners and their associated attributes based on given criteria. One example of criteria includes attribute matching. For example, the criteria may specify that all fasteners having matching part ID numbers and matching collar numbers are sorted or grouped together. Examples of other attributes that may be used in the sorting are illustrated in FIG. 4. The given criteria may be predefined generically and/or customized for the particular part/product, including end user defined criteria. At block 615 the routine 600 generates initial groupings based on the sorting at block 610.

At block 620 the routine 600 conducts a proximity check for a first group in the initial grouping. For example, this group may contain similar fasteners that may or may not be proximate in location with respect to a given part or group of parts. Accordingly, proximity checking may include conducting a contiguous volume search with respect to fasteners in an initial group. Proximity checking may also include analyzing the parts or grouping of parts through which fasteners in a group pass and other techniques. An example of a set of possible proximity groupings is illustrated with respect to FIG. 7.

At decision block 625 if the next fastener in the group being tested is proximate to the first fastener in that group, then the routine 600 continues at block 630, where the fastener is placed in a subgroup with the first (proximate) fastener. Otherwise, the routine 600 places the fastener in another group with proximate fasteners (block 650) or forms a new group for that fastener. After block 650 the routine 600 proceeds to block decision block 635, where the routine 600 determines whether or not there are more fasteners in the current initial group to check. If there are more fasteners, the routine 600 loops back to block 625 to check the next fastener. Otherwise, the routine 600 continues at block 640 where the routine 600 returns a grouping output (e.g., consisting of an indication of a group of proximate and related fasteners). At decision block 645, the routine 600 determines whether or not there are more initial fastener groups to check. If there are more initial fastener groups to check, the routine 600 loops back to block 620. Otherwise the routine 600 ends.

Figure 7:
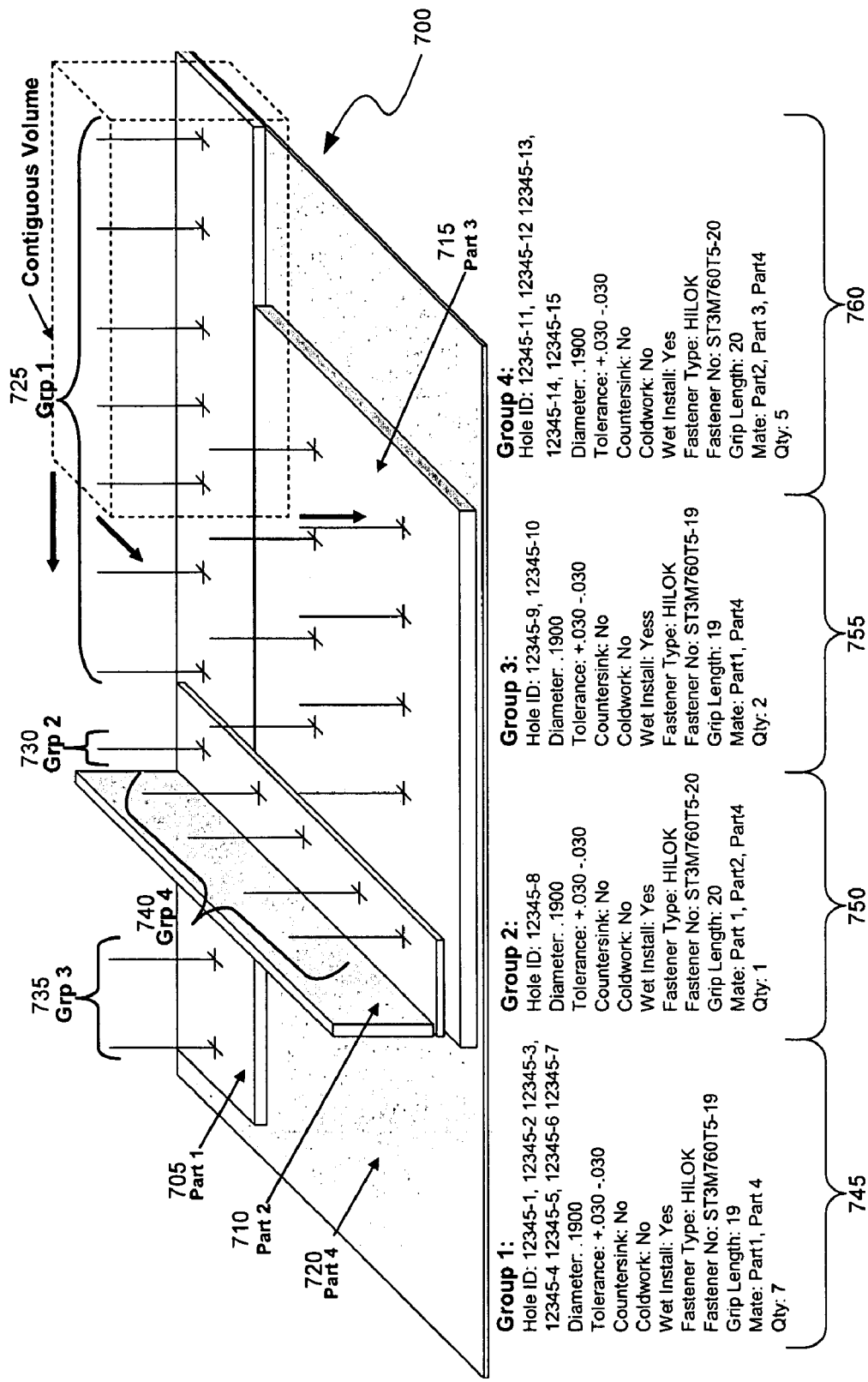
FIG. 7 is a display diagram showing a sample fastener grouping based on a model diagram in an embodiment.

FIG. 7 is a display diagram showing an example of groupings with respect to a three-dimensional model consisting of four parts: Part 1 705, Part 2 710, Part 3 715, and Part 4 720. The four parts (705, 710, 715, and 720) are joined together using multiple fasteners, which the facility has sorted into groups based on simulators with respect to fastener attributes and with respect to proximity. The groups include Group 1 725, Group 2 730, Group 3 735, and Group 4 740. The bottom of the display diagram shows attribute information for each of the groups including attribute information for Group 1 745, attribute information for Group 2 750, attribute information for Group 3 755, and attribute information for Group 4 760. As shown, the attribute information for each group includes hole ID information, diameter information, tolerance information, countersink information, cold work information, wet install information, fastener type information, fastener number information, grip length information, and mate information. The mate information includes an indication of each of the parts through which the fastener will pass when fully assembled. The group attribute information (745, 750, 755, and 760) may also include a quantity indicator, indicating the quantity of fasteners within that group. For example, Group 2 740 includes one fastener while Group 4 740 includes five fasteners.

From the foregoing, it will be appreciated that specific embodiments have been described herein for purposes of illustration, but that various modifications may be made without deviating from the spirit and scope of the invention and aspects of the invention described in the context of particular embodiments may be combined or eliminated in other embodiments. For example, while certain embodiments describe the collection and grouping of information relating to fasteners, the facility may be applied to other items besides fasteners in other embodiments. For example, the facility may be applied to group/organize other types of parts, inventories, etc.

Although advantages associated with certain embodiments of the invention have been described in the context of those embodiments, other embodiments may also exhibit such advantages. Additionally, none of the foregoing embodiments need necessarily exhibit such advantages to fall within the scope of the invention. Accordingly, the invention is not limited except as by the appended claims.

I claim:

1. A method in a computer system for managing attribute information for a selected part type, the method comprising:
   conducting proximity checking with respect to multiple instances of the selected part type, wherein each of the instances of the selected part type is associated with a common part or product, and wherein the proximity checking relates to relative locations or placements of the instances of the selected part type, and wherein the proximity checking allows for grouping of the instances of the selected part type;

identifying attribute information associated with each instance of the selected part type;

arranging the instances of the selected part type into one or more groups based on conducting the proximity checking and applying grouping criteria to the attribute information; and returning an indication of the one or more groups for use in generating manufacturing process plans, work instructions, or both manufacturing process plans and work instructions.

2. The method of claim 1 wherein the selected part type is fasteners, and wherein the attribute information used to arrange the instances of the selected part type into one or more groups includes part ID number.

3. The method of claim 1 wherein the selected part type is fasteners, and wherein the attribute information used to arrange the instances of the selected part type into one or more groups includes fastener head orientation.

4. The method of claim 1 wherein the selected part type is fasteners, and wherein attribute information used to arrange the instances of the selected part type into one or more groups includes fastener hole type.

5. The method of claim 1 wherein the selected part type is fasteners, and wherein the attribute information used to arrange the instances of the selected part type into one or more groups includes fastener attribute information or hole diameter attribute information.

6. The method of claim 1 wherein the selected part type is fasteners, and wherein conducting the proximity checking includes determining whether each fastener instance in a group of fastener instances associated with a contiguous volume passes through a same set of solids.

7. The method of claim 1 wherein the returned group information includes a fastener group object, and wherein the fastener group object includes children each comprising an instance of a fastener.

8. The method of claim 1 wherein arranging the instances of the selected part type into one or more groups based on conducting the proximity checking and applying grouping criteria to the identified attribute information includes performing an initial attribute-based sort prior to conducting the proximity checking.

9. The method of claim 1:
wherein at least one of the instances of the selected part type corresponds to an occurrence of a first fastener having a first location attribute;
wherein at least one of the instances of the selected part type corresponds to an occurrence of a second fastener having a second location attribute
wherein conducting the proximity checking includes automatically determining whether the first fastener and second fastener are proximate to one another based, at least in part, on the first location attribute, the second location attribute, and a definition of proximity that is specified in the grouping criteria.

10. The method of claim 1:
wherein at least one of the instances of the selected part type corresponds to an occurrence of a first fastener;
wherein at least one of the instances of the selected part type corresponds to an occurrence of a second fastener;

wherein conducting the proximity checking includes automatically determining whether the first fastener and the second fastener both pass through the same solid object; and wherein the solid object is specified in the grouping criteria.

11. A computer-readable medium containing instructions for controlling aspects of a computing device to perform a method comprising:

conducting proximity checking with respect to multiple instances of a specified item type associated with an aggregation of items, wherein the proximity checking relates to location of each of the instances of the selected item type with respect to other items in the aggregation of items, and wherein the conducting the proximity checking allows for grouping of the instances of the selected item type;

identifying attribute information associated each instance of the selected item type;

organizing the instances of the specified item type into one or more groups based on conducting the proximity checking and applying grouping criteria to the attribute information; and returning an indication of the one or more groups as output.

12. The computer-readable medium of claim 11 wherein the aggregation of items is a part or assembly of parts, wherein the selected item type is fasteners, and wherein the output includes group information for generating manufacturing process plans or work instructions.

13. The computer-readable medium of claim 11 wherein the selected item type is fasteners used in assembling parts, and wherein the grouping criteria include determining whether the instances have common fastener part numbers.

14. The computer-readable medium of claim 11 wherein the selected item type is fasteners used in assembling parts, and wherein the grouping criteria include determining whether the instances have common nut or washer part numbers.

15. The computer-readable medium of claim 11 wherein the aggregation of items is a part or assembly of parts, wherein the selected item type is spot welds, and wherein at least a portion of the output is for use an generating robot programming instructions.

16. The computer-readable medium of claim 11 wherein the selected item type is fasteners used in assembling parts, and wherein the grouping criteria include determining whether the instances have common tolerance characteristics.

17. The computer-readable medium of claim 11 wherein the selected item type is fasteners used in assembling parts, and wherein the grouping criteria include determining whether the instances have common countersink characteristics.

18. The computer-readable medium of claim 11 wherein the selected item type is fasteners used in assembling parts, and wherein the grouping criteria include determining whether the instances have common installation characteristics.

19. A system for managing attribute information for use in manufacturing processes, the system comprising:
a design engineering data storage component including attribute information associated with multiple instances of fasteners, wherein each of the multiple instances of the fasteners is associated with a common part or product;

a processing component for automatically generating fastener group output based on at least some of the contents of the design engineering data storage component, wherein the fastener group output is used for creating manufacturing-related process specifications, and wherein automatically generating the output includes performing grouping based, at least in part on conducting proximity checking.

20. The system of claim 19 wherein conducting the proximity checking includes determining whether the instances of the fasteners pass through the same set of solids when assembled.

21. The system of claim 19 wherein the proximity checking is conducted using a contiguous volume search on a three-dimensional graphical model.

22. The system of claim 19, further comprising a computer aided manufacturing application and a computer aided design application, wherein the computer aided manufacturing application and the computer aided design application are applications in a software environment comprising an integrated suite of computer aided design (CAD), computer aided engineering (CAE), and computer aided manufacturing (CAM) applications for product definition and simulation.

23. The system of claim 19, further comprising an input component for receiving user defined criteria for performing attribute sorting prior to performing the grouping based on proximity checking.

24. The system of claim 19, further comprising a computer aided manufacturing component used in generating the manufacturing-related process specifications based on the output, wherein the manufacturing-related process specification include work or assembly instructions.

25. The system of claim 19 further comprising a manufacturing data storage component including manufacturing requirements and rules associated with manufacturing the common part or product, wherein the manufacturing requirements and rules are used in generating the fastener group output.

26. The system of claim 19 wherein automatically generating the output includes sorting the instances of the fasteners based on common attribute information before performing grouping based on the proximity checking.

27. The system of claim 19 wherein conducting the proximity checking includes determining whether the instances of the fasteners pass through the same set of solids when assembled and using a contiguous volume search on a three-dimensional graphical model to group only instances of fasteners located within a contiguous volume.

* * * * *

UNITED STATES PATENT AND TRADEMARK OFFICE
CERTIFICATE OF CORRECTION

PATENT NO. : 7,343,209 B2  Page 1 of 1
APPLICATION NO. : 11/269458
DATED : March 11, 2008
INVENTOR(S) : Anelle It is certified that error appears in the above-identified patent and that said Letters Patent is hereby corrected as shown below:

In column 7, line 55, in Claim 9, after "attribute" insert -- ; --.

In column 8, line 15, in Claim 11, after "wherein" delete "the".

In column 8, line 44, in Claim 15, delete "an" and insert -- in --, therefor.

Signed and Sealed this

Twelfth Day of August, 2008

JON W. DUDAS
*Director of the United States Patent and Trademark Office*